United States Patent
Hasaki et al.

(10) Patent No.: US 6,866,450 B2
(45) Date of Patent: Mar. 15, 2005

(54) ENTRY SHEET FOR DRILLING AND METHOD FOR DRILLING HOLE

(75) Inventors: Takuya Hasaki, Tokyo (JP); Shinya Komatsu, Tokyo (JP); Norio Nagai, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 168 days.

(21) Appl. No.: 10/278,907

(22) Filed: Oct. 24, 2002

(65) Prior Publication Data

US 2003/0100456 A1 May 29, 2003

(30) Foreign Application Priority Data

Oct. 31, 2001 (JP) .......................................... 2001/334651
Dec. 13, 2001 (JP) .......................................... 2001/380411

(51) Int. Cl.⁷ ........................... B23B 35/00; B23B 41/00
(52) U.S. Cl. ........................................ 408/1 R; 408/87
(58) Field of Search ........................................ 408/1 R

(56) References Cited

U.S. PATENT DOCUMENTS

| | | | | |
|---|---|---|---|---|
| 4,781,495 A | * | 11/1988 | Hatch et al. | 408/1 R |
| 4,929,370 A | * | 5/1990 | Hatch et al. | 508/100 |
| 5,067,859 A | * | 11/1991 | Korbonski | 408/1 R |
| 5,082,402 A | * | 1/1992 | Gaku et al. | 408/1 R |
| 5,480,269 A | * | 1/1996 | Ejiri et al. | 408/1 R |
| 5,507,603 A | * | 4/1996 | Nakano et al. | 408/1 R |
| 5,785,465 A | * | 7/1998 | Korbonski | 408/1 R |
| 5,961,255 A | * | 10/1999 | Korbonski | 408/1 R |
| 6,200,074 B1 | * | 3/2001 | Miller et al. | 408/1 R |
| 6,565,295 B2 | * | 5/2003 | Ohashi et al. | 408/87 |

* cited by examiner

*Primary Examiner*—Ellen M. McAvoy
(74) *Attorney, Agent, or Firm*—Wendeoth, Lind & Ponack, L.L.P.

(57) ABSTRACT

An entry sheet for drilling for a printed wiring board material, which comprises a water-soluble resin (A) and a water-insoluble lubricant (B) as essential components, an entry sheet for drilling for a printed wiring board material, which sheet comprises a metal foil having a thickness of 5 to 200 $\mu$m and a thermosetting resin (E) layer having an average thickness of 1 to 10 $\mu$m, the thermosetting resin (E) layer being formed on one surface of the metal foil, and a method for drilling a hole by using the above entry sheet.

16 Claims, No Drawings

ENTRY SHEET FOR DRILLING AND METHOD FOR DRILLING HOLE

FIELD OF THE INVENTION

The present invention relates to an entry sheet for drilling for use in printed wiring board material fields and a method for drilling a hole by using the above sheet. More specifically, it relates to an entry sheet for drilling which sheet serves to prevent winding of a resin around a drill bit, alleviate shock to the drill bit or increase drill-gripping properties by using the above entry sheet and which thus enables high-quality drilling excellent in a hole shape and hole-location accuracy and to a method for drilling a hole.

BACKGROUND OF THE INVENTION

U.S. Pat. No. 4,781,495 and U.S. Pat. No. 4,929,370 disclose methods for drilling a hole in a printed wiring board material in which, when a hole for conduction between front and reverse surfaces is made with a drill, one surface or each surface of the printed wiring board material is provided with a sheet obtained by impregnating a porous sheet such as paper with a water-soluble lubricant, concretely a mixture of glycols such as diethylene glycol or dipropylene glycol, a synthetic wax such as a fatty acid ester, and a nonionic surfactant. However, these methods have defects. The defects are that the effect of preventing heat generation of a drill is insufficient, that the impregnation of the porous sheet with the above mixture is poor and that the sheet is sticky.

As means for solving the above defects, JP-A-4-92494 and JP-A-6-344297 propose drilling methods using a sheet composed of polyethylene glycol or polyether ester and a water-soluble lubricant. However, although the above methods improve the quality of a drilled hole and provide an improvement in stickiness, the winding tendency of a resin around a drill bit becomes pronounced. In some cases, there is found a decrease in hole-location accuracy due to run-out. Therefore, a further improvement is necessary. There is found a tendency that such a decrease in hole-location accuracy increases with decreasing the diameter of a drill bit. Therefore, improvements are required for applying the above methods when a drill having an extreme small diameter is used.

SUMMARY OF THE INVENTION

It is an object of the present invention to provide an entry sheet for drilling which sheet prevents winding of a resin around a drill bit, gives a hole having an excellent shape and is excellent in hole-location accuracy, and a method for drilling a hole.

The present invention 1 provides an entry sheet for drilling for a printed wiring board material, which sheet comprises a water-soluble resin (A) and a water-insoluble lubricant (B) as essential components.

The present invention 1 further provides an entry sheet for drilling according to the above sheet, wherein the amount of the water-insoluble lubricant (B) is 0.1 to 20 parts by weight per 100 parts by weight of the total amount of the water-soluble resin (A) and the water-insoluble lubricant (B).

The present invention 1 further provides an entry sheet for drilling according to the above sheet, wherein the water-soluble resin (A) further comprises a water-soluble lubricant (C).

The present invention 1 further provides an entry sheet for drilling according to the above sheet, wherein the sheet further comprises a surfactant (D).

The present invention 2 provides an entry sheet for drilling for a printed wiring board material, which sheet comprises a metal foil having a thickness of 5 to 200 $\mu$m, preferably 20 to 200 $\mu$m, and a thermosetting resin (E) layer having an average thickness of 1 to 10 $\mu$m, the thermosetting resin (E) layer being formed on one surface of the metal foil.

The present invention 2 further provides an entry sheet for drilling according to the above sheet, which comprises the metal foil, the thermosetting resin (E) layer formed on one surface of the metal foil, and further a water-soluble resin (A) layer formed on the thermosetting resin (E) layer.

The present invention 2 further provides a method for drilling a hole in a printed wiring board material, comprising disposing an entry sheet recited above such that a metal foil surface side of the entry sheet is brought in contact with a printed wiring board material and drilling a hole from a resin surface side with a drill.

DETAILED DESCRIPTION OF THE INVENTION

The present inventors have found that, by using, as an entry sheet for drilling, a sheet comprising a water-insoluble lubricant and a water-soluble resin as essential components, winding of a resin around a drill bit is prevented and thus excellent hole-location accuracy and an excellent hole shape can be obtained. On the basis of the above finding, the present inventors have completed the present invention.

Further, the present inventors have found that by using, as an entry sheet for drilling, a metal foil, particularly preferably an aluminum foil, having a coating made of a thermosetting resin, shock to a drill bit is alleviated and gripping properties are increased so that excellent hole-location accuracy and an excellent hole shape can be obtained. On the basis of the above finding, the present inventors have completed the present invention.

The water-soluble resin (A) used in the present inventions 1 and 2 is not specially limited, so long as it is a high molecular weight substance which in an amount of 1 g or more is soluble in 100 g of water at normal temperature under normal pressure. More preferable examples thereof include polyethylene glycol, polyethylene oxide, polypropylene glycol, polypropylene oxide, polyvinyl alcohol, sodium polyacrylate, polyacrylamide, polyvinylpyrrolidone, carboxymethylcellulose, polytetramethylene glycol and polyether ester. These resins may be used alone or in combination as required.

The polyether ester preferably used in the present inventions 1 and 2 is not specially limited so long as it is selected from esterification products of polyalkylene oxide. For example, it includes resins obtained by reacting glycols or ethylene oxides with a polyvalent carboxylic acid, its anhydride or its ester, and these resins may be used alone or in combination as required. Examples of polymers of the glycols and the ethylene oxides include polyethylene glycol, polyethylene oxide, polypropylene glycol, polypropylene oxide, polytetramethylene glycol and copolymers of these. Examples of the polyvalent carboxylic acid, its anhydride or its ester include phthalic acid, isophthalic acid, terephthalic acid, sebacic acid, dimethylesters and diethylesters of these, and pyromellitic acid anhydride.

The melting point or the softening point of the water-soluble resin (A) is in the range of from 30 to 200° C., preferably from 40 to 150° C.

The water-insoluble lubricant (B) used in the present inventions 1 and 2 is not specially limited so long as it is selected from water-insoluble lubricants which are generally used for a thermoplastic resin or a thermosetting resin. These lubricants are known. Concrete examples thereof include amide-based compounds such as ethylenebisstearamide, oleic amide, stearic acid amide and methylenebisstearamide; fatty acid-based compounds such as lauric acid, stearic acid, palmitic acid and oleic acid; fatty-acid-ester-based compounds such as butyl stearate, butyl oleate and glycol laurate; aliphatic-hydrocarbon-based compounds such as liquid paraffin and polyethylene wax; and higher aliphatic alcohol such as olein alcohol. These lubricants may be used alone or in combination depending upon a purpose. Preferred are amide-based compounds, fatty-acid-based compounds and fatty-acid-ester-based compounds.

The amount of the water-insoluble lubricant (B) is in the range of 0.1 to 20 parts by weight per 100 parts of the total amount of the water-soluble resin (A) and the water-insoluble lubricant (B). When it is smaller than 0.1 part by weight, the effect of preventing winding of a resin around a drill bit is not found. When it is larger than 20 parts by weight, the water-insoluble lubricant is apt to bleed and the sheet becomes sticky, which does not meet the objects of the present invention.

The water-soluble lubricant (C) usable in the present inventions 1 and 2 concretely includes monoethers of polyoxyethylene such as polyoxyethylene oleyl ether, polyoxyethylene cetyl ether, polyoxyethylene stearyle ether, polyoxyethylene lauryl ether, polyoxyethylene nonyl phenyl ether or polyoxyethylene octyl phenyl ether; polyoxyehtylene monostearate, polyoxyethylene sorbitan monostearate; polyglycerine monostearates such as hexaglycerine monostearate or decahexaglycerine monostearate; and polyoxyethylene propylene block polymer. These lubricants may be used alone or in combination as required.

The amount of the water-soluble lubricant (C) in the present inventions 1 and 2 is in the range of 10 to 80 parts by weight per 100 parts of the total amount of the water-soluble resin (A), the water-insoluble lubricant (B) and the water-soluble lubricant (C). When it is smaller than 10 parts by weight, the viscosity becomes too high. When it is larger than 80 parts by weight, undesirably, the sheet becomes fragile.

The surfactant (D) which can be used together with the water-soluble resin in the present inventions 1 and 2 is not specially limited so long as it is selected from surfactants which are generally used for washing or for emulsifying and dispersing. Examples thereof include anionic surfactants, cationic surfactants, nonionic surfactants and amphoteric surfactants. Particularly preferred are nonionic surfactants, and sorbitan alkyl esters such as sorbitan monolaurate, sorbitan monopalmitate and sorbitan monostearate are listed. The amount of the surfactant (D) is in the range of 0.01 to 5 parts by weight per 100 parts of the total amount of the water-soluble resin (A) and the water-insoluble lubricant (B).

The thermosetting resin (E) used in the present invention 2 is not specially limited so long as it is selected from generally used thermosetting resins. These thermosetting resin are known. Concrete examples thereof include a phenol resin, an epoxy resin, an acrylic resin, an unsaturated polyester resin, a polyurethane resin, an alkyd resin, a silicone resin, a cyanate ester resin and a maleimide resin. These thermosetting resins may be used alone or in combination depending upon a purpose. Preferred is a thermosetting resin containing an epoxy resin or a cyanate ester resin as an essential component. A curing level of the thermosetting resin (E) showing a partial gel or a higher curing level is sufficient.

The thermosetting resin (E) used in the present invention 2 may be used in combination with a curing agent and a curing accelerator for the thermosetting resin (E) as required. The curing agent and the curing accelerator are known. The curing agent and the curing accelerator are not specially limited so long as they are selected from generally-used curing agents and generally-used curing accelerators for the thermosetting resin (E).

The thermosetting resin (E) in the present invention 2 may contain, as required, various kinds of compounds, inorganic fillers or other additives in such a range that the inherent properties of the resin (E) are not impaired. These materials are known. These materials are not specially limited so long as they are selected from generally used compounds, generally used inorganic fillers and generally used additives.

In the present invention 2, the average thickness of the coating of the thermosetting resin (E) formed on the metal foil is in the range of 1 to 10 $\mu$m. When the average thickness of the coating is less than 1 $\mu$m, the effects of alleviating shock to a drill bit or increasing gripping properties are poor. When it is more than 10 $\mu$m, smears are apt to occur due to leavings of the thermosetting resin, which does not meet the objects of the present invention.

The manufacturing method of the sheet of the present invention 1 is not specially limited so long as it is a known method which is industrially used. Concrete examples thereof include a method in which the water-soluble resin (A) and the water-insoluble lubricant (B) are properly warmed or heated by using a roll, a kneader or other kneading means to form a homogeneous mixture and the mixture is molded into a sheet on a releasing film by a roll method or a curtain coating method; a method in which the above mixture is molded with a press, a roll or a T-die extruder to form a sheet having a desired thickness in advance; and a method in which the above mixture is dissolved or dispersed in an organic solvent, the resultant solution is applied to a releasing film and the applied solution is dried by heating to obtain a sheet.

In the present invention 1, as a method for combining the entry sheet with the metal foil, for example, there are a method in which the sheet is formed on the metal foil at the time of forming the sheet and a method in which the metal foil is stacked on at least one surface of the sheet, and the metal foil and the sheet are bonded to each other by heating and pressing with a press, a roll or the like and optionally using an adhesive or the like.

In the present invention 2, the method for producing the entry sheet for drilling is not specially limited so long as it is a known industrial method. Concretely, for example, there is a method in which the thermosetting resin (E) is applied to one surface of the metal foil and then the thermosetting resin (E) is heated to form a coating. As a method for forming a sheet layer of the water-soluble resin (A) on the thermosetting resin (E) layer, for example, there are a method in which the water-soluble resin (A) is properly warmed or heated by using a roll, a kneader or other kneading means to form a homogenous mixture and a sheet layer is formed on the aluminum foil on which the thermosetting resin (E) layer is already formed by using the above homogenous mixture according to a roll method or a curtain coating method; and a method in which the above mixture is molded with a press, a roll or a T-die extruder to form a sheet having a desired thickness in advance, then the sheet is stacked on the metal foil on which the thermosetting resin (E) layer is already formed and these materials are heated and pressed with a press or a roll to bond these materials.

In the present invention 1, the thickness of the entry sheet to which no metal foil is attached is in the range of 10 to 500 $\mu$m, more preferably 20 to 300 $\mu$m. When the thickness of the sheet is less than 10 $\mu$m, the quality of a hole to be made decreases. When the thickness of the sheet exceeds 500 $\mu$m, winding around a drill bit increases, which does not meet the objects of the present invention.

The thickness of the water-soluble resin (A) sheet layer of the entry sheet for drilling in the present invention 2 is in the range of 20 to 500 $\mu$m. When it is less than 20 $\mu$m, the quality of a hole to be made decreases. When it exceeds 500 $\mu$m, undesirably, winding around a drill bit occurs.

A material for the metal foil suitably used in the present inventions 1 and 2 is not specially limited, so long as it is selected from known relatively-soft metal foils which are industrially used. Concretely, examples thereof include pure aluminum type or alloy aluminum type hard aluminum, semi-hard aluminum and soft aluminum, copper, and magnesium alloy. Pure aluminum type is particularly preferred. These materials may be used alone or in combination as required. The thickness of the metal foil is in the range of 5 to 200 $\mu$m, preferably in the range of 20 to 200 $\mu$m. When the thickness of the metal foil is less than the above lower limit, undesirably, burrs of a substrate are apt to occur. When it exceeds the above upper limit, undesirably, the discharge of chips to be generated is difficult.

The method for drilling, provided by the present invention, is a processing method in which the entry sheet for drilling is disposed on a topmost surface of a printed wiring board material such as a copper clad laminate or a multilayer board such that a metal foil surface side of the entry sheet is brought into contact with the printed wiring board material and a hole is made with a drill from a sheet surface side.

EFFECT OF THE INVENTION

When the entry sheet for drilling containing as essential components a water-soluble resin and a water-insoluble lubricant, provided by the present invention, is used for drilling a hole in a printed wiring board material, winding of a resin around a drill bit is suppressed so that shock by a thermosetting resin at a drilling time is alleviated and the gripping properties of the drill bit increases. Accordingly, a high-quality drilling processing excellent in a hole shape and hole-location accuracy is enabled. Therefore, the present invention has a remarkably high industrial practicality.

EXAMPLES

The present invention will be explained more in detail with reference to Examples and Comparative Examples.

Example 1

50 parts by weight of a polyethylene glycol dimethyl terephthalate polycondensate (PAOGEN PP-15, supplied by Dai-ichi Kogyo seiyaku Co., Ltd.), 45 parts by weight of polyoxyethylene monostearate (Nonion S-40, supplied by NOF Corporation) and 5 parts by weight of stearic acid amide (amide-S, supplied by Kao Corporation) were kneaded with a kneader in a nitrogen atmosphere at a temperature of 150° C., and the kneaded mixture was extruded with an extruder to form a sheet having a thickness of 0.1 mm (entry sheet for drilling). Two glass epoxy-based copper-clad laminates having a thickness of 0.4 mm each were stacked. The obtained entry sheet for drilling was placed on the upper surface of the stacked glass epoxy-based copper-clad laminates and a backup board (paper phenol laminate) was disposed on the lower surface of the stacked glass epoxy-based copper-clad laminates. Drilling was carried out under conditions of a drill bit: 0.3 mm$\phi$, the number of revolutions: 100,000 rpm, and a feeding rate: 2.5 $\mu$/rev., to obtain holes. The holes were evaluated. Table 1 shows the results.

Example 2

60 parts by weight of a polyethylene glycol.dimethyl terephthalate polycondensate (PAOGEN PP-15), 20 parts by weight of polyethylene glycol having a number average molecular weight of 20,000, 10 parts by weight of polyoxyethylene sorbitan laurate (Nonion LT-221, supplied by NOF Corporation) and 10 parts by weight of oleic amide (amide ON, supplied by Kao Corporation) were used, and a sheet having a thickness of 0.1 mm was prepared in the same manner as in Example 1. The sheet was stacked on one surface of an aluminum foil (material: IN30) having a thickness of 100 $\mu$m and the sheet and the aluminum foil were bonded by a heating roll to obtain an aluminum foil combined sheet (entry sheet for drilling). The entry sheet for drilling was used for drilling similarly to Example 1, and holes were evaluated. Table 1 shows the results.

Example 3

20 parts by weight of a polyethylene glycol.dimethyl terephthalate polycondensate (PAOGEN PP-15), 10 parts by weight of polyethylene oxide (ALKOX R-150, supplied by MEISEI CHEMICAL WORKS, LTD), 60 parts by weight of polyoxyethylene propylene block polymer (Pronon 208, supplied by NOF Corporation), 10 parts by weight of oleic amide (amide ON, supplied by Kao Corporation) and 2 parts by weight of sorbitan monostearate (Nonion SP60R, supplied by NOF Corporation) were used, and an aluminum foil combined sheet for drilling (entry sheet for drilling) was prepared in the same manner as in Example 2. The entry sheet for drilling was used for drilling similarly to Example 1, and holes were evaluated. Table 1 shows the results.

Comparative Example 1

An aluminum foil combined sheet for drilling (entry sheet for drilling) was obtained in the same manner as in Example 2 except that the oleic amide used in Example 2 was not used. The entry sheet for drilling was used for drilling similarly to Example 1, and holes were evaluated. Table 1 shows the results.

Comparative Example 2

An aluminum foil (material: IN30) having a thickness of 150 μm was used as an entry sheet for drilling. The aluminum foil was used for drilling similarly to Example 1. Holes were evaluated. Table 1 shows the results.

TABLE 1

Evaluation results of holes

| | Winding of resin around drill bit | Hole wall roughness (μm) | | Hole location accuracy (μm) | |
|---|---|---|---|---|---|
| | | Average value | Maximum value | Average value | Maximum value |
| Example 1 | Extremely little | 15 | 24 | 6 | 16 |
| Example 2 | Extremely little | 13 | 21 | 6 | 15 |
| Example 3 | Extremely little | 14 | 22 | 7 | 17 |
| Comparative Example 1 | Much | 18 | 33 | 11 | 27 |
| Comparative Example 2 | Nil | 27 | 45 | 10 | 24 |

(Test Methods)

Winding of a resin: According to a visual observation of a drill bit after 2,000-hits-hole-processing.

Hole wall roughness: Regarding 20 holes of the lower laminate of the stacked glass epoxy-based copper-clad laminates after 2,000-hits-hole-processing, a sample was treated by plating and then a cross section was observed through a microscope, to measure hole wall roughness. An average value and a maximum value were shown.

Hole location accuracy: Regarding 670 hits of 2,000 hits of the bottom plate after 2,000-hits-hole-processing, misregistration between a hole-location reference value and the location of a hole in the lower laminate of the stacked glass epoxy-based copper-clad laminates was measured with a coordinate measuring machine. An average value and a maximum value were shown.

Example 4

82 parts by weight of a bisphenol A type epoxy resin (Epikote 1001, supplied by Japan Epoxy Resins Co., Ltd) and 18 parts by weight of a phenol novolak resin (PHENOLITE TD 2131, supplied by DAINIPPON INK AND CHEMICALS, INCORPORATED) were dissolved in methyl ethyl ketone, and 0.1 part by weight of dimethylbenzylamine was mixed with the above-obtained solution to obtain a varnish. The varnish was applied to one surface of an aluminum foil (material: IN30) having a thickness of 50 μm, the applied varnish was heated at 120° C. for 10 minutes to obtain an aluminum foil-thermosetting resin combined sheet (entry sheet for drilling) having a coating having an average thickness of 6 μm.

Three glass epoxy-based copper-clad laminates having a thickness of 0.1 mm each were stacked. The above obtained entry sheet for drilling was disposed on the upper surface of the stacked laminates, and a backup board (paper phenol laminate) was disposed on the lower surface of the stacked laminates. Drilling was carried out under conditions of a drill bit: 0.1 mmφ, the number of revolutions: 150,000 rpm, and a feeding rate: 2.5 μ/rev., to obtain holes. The holes were evaluated. Table 2 shows the results.

Example 5

50 parts of prepolymer (BT 2160, supplied by supplied by Mitsubishi Gas Chemical Co., Inc.) of 2,2-bis(4-cyanatephenyl)propane and 50 parts by weight of a lactone-modified epoxy resin (PLACCEL G105, supplied by DAICEL CHEMICAL INDUSTRIES, LTD.) were dissolved in methyl ethyl ketone, and 0.1 part by weight of zinc octylate was mixed with the so-obtained solution, to obtain a varnish. The varnish was applied to one surface of an aluminum foil (material: 1060) having a thickness of 100 μm, the applied varnish was heated at 130° C. for 10 minutes to obtain an aluminum foil-thermosetting resin combined sheet (entry sheet for drilling) having a coating having an average thickness of 4 μm.

Three glass-substrate bismaleimide-triazine-based copper-clad laminates having a thickness of 0.1 mm each were stacked. The above obtained entry sheet for drilling was disposed on the upper surface of the stacked laminates, and a backup board (paper phenol laminate) was disposed on the lower surface of the stacked laminates. Drilling was carried out under the same conditions as those of Example 4, to obtain holes. The holes were evaluated. Table 2 shows the results.

Example 6

65 parts by weight of a polyethylene glycol.dimethyl terephthalate polycondensate (PAOGEN PP-15, supplied by Dai-ichi Kogyo seiyaku Co., Ltd.), 30 parts by weight of polyethylene glycol having a number average molecular weight of 8,000 and 5 parts by weight of stearic acid amide (amide-S) were kneaded with a kneader in a nitrogen atmosphere at a temperature of 150° C., and the kneaded mixture was extruded with an extruder to form a water-soluble resin sheet having a thickness of 0.1 mm. The water-soluble resin sheet was stacked on the thermosetting resin surface of the aluminum foil-thermosetting resin combined sheet having an adhesion layer having an average thickness 4 μm, obtained in the Example 5, and these sheets were bonded to each other with a heating roll, to obtain a water-soluble-resin-based entry sheet for drilling. The water-soluble-resin-based entry sheet for drilling was used for drilling similarly to Example 4, and holes were evaluated. Table 2 shows the results.

Comparative Example 3

Attempts to make holes were carried out under the same drilling conditions as those in Example 5 except that the entry sheet for drilling was replaced with an aluminum foil (material: IN30) having a thickness of 150 μm. During the processing, a drill bit was broken. Attempts to make holes were carried out again. The drill bit was similarly broken.

Comparative Example 4

A vinyl chloride coating having a thickness of 9 μm was formed on one surface of an aluminum foil (material: 1060) having a thickness of 100 μm, to obtain an aluminum foil-thermoplastic resin combined sheet. The above com bined sheet was used as an entry sheet for drilling, and drilling was carried out similarly to Example 4. Holes were evaluated and Table 2 shows the results.

TABLE 2

Evaluation results of holes

| | Break of drill bit | Hole wall roughness ($\mu$m) | | Hole location accuracy ($\mu$m) | |
|---|---|---|---|---|---|
| | | Average value | Maximum value | Average value | Maximum value |
| Example 4 | Nil | 3 | 7 | 7 | 18 |
| Example 5 | Nil | 3 | 6 | 7 | 21 |
| Example 6 | Nil | 2 | 4 | 8 | 19 |
| Comparative Example 3 | Break occurred at 900 and 1,500 hits | — | — | — | — |
| Comparative Example 4 | Nil | 5 | 12 | 13 | 37 |

What is claimed is:

1. An entry sheet for drilling for a printed wiring board material, which comprises a water-soluble resin (A) and a water-insoluble lubricant (B) as essential components.

2. An entry sheet according to claim 1, wherein the thickness of the sheet is 10 to 500 $\mu$m.

3. An entry sheet according to claim 1, wherein the amount of the water-insoluble lubricant (B) is 0.1 to 20 parts by weight per 100 parts by weight of the total amount of the water-soluble resin (A) and the water-insoluble lubricant (B).

4. An entry sheet according to claim 1, wherein the water-soluble resin (A) is at least one member selected from the group consisting of polyethylene glycol, polyethylene oxide, polypropylene glycol, polypropylene oxide, polyvinyl alcohol, sodium polyacrylate, polyacrylamide, polyvinylpyrrolidone, carboxymethylcellulose, polytetramethylene glycol and polyether ester.

5. An entry sheet according to claim 4, which further comprises a water-soluble lubricant (C).

6. An entry sheet according to claim 3, wherein the water-insoluble lubricant (B) is at least one member selected from the group consisting of amide-based compounds, fatty-acid-based compounds and fatty-acid-ester-based compounds.

7. An entry sheet according to claim 5, wherein the water-soluble lubricant (C) is at least one member selected from the group consisting of monoether of polyoxyethylene, ester of polyoxyethylene, polyoxyethylene sorbitan monostearate, polyglycerine monostearate and a polyoxyethylene propylene block polymer.

8. An entry sheet according to claim 1, which further comprises a surfactant (D).

9. An entry sheet according to claim 1, wherein a metal foil is combined with one surface of the sheet.

10. An entry sheet according to claim 9, wherein the metal foil has a thickness of 5 to 200 $\mu$m.

11. An entry sheet for drilling for a printed wiring board material, which sheet comprises a metal foil having a thickness of 5 to 200 $\mu$m and a layer of a thermosetting resin (E) which layer has an average thickness of 1 to 10 $\mu$m, the layer of the thermosetting resin (E) being formed on one surface of the metal foil, which further comprises a water-soluble resin (A) layer having a thickness of 20 to 500 $\mu$m on the thermosetting resin (E) layer.

12. An entry sheet according to claim 11, wherein the thermosetting resin (E) is a thermosetting resin containing an epoxy resin or a cyanate ester resin as an essential component.

13. An entry sheet according to claim 11, wherein the water-soluble resin (A) layer further comprises a water-insoluble lubricant (B).

14. An entry sheet according to claim 11, wherein the water-soluble resin (A) layer further comprises a water-soluble lubricant (C).

15. An entry sheet according to claim 11, wherein the metal foil is an aluminum foil.

16. A method for drilling a hole in a printed wiring board material, comprising disposing the entry sheet for drilling recited in claim 11 on a printed wiring board material such that a metal foil surface side of the entry sheet is brought in contact with the printed wiring board material and drilling a hole with a drill from a resin surface side.

* * * * *